(12) United States Patent
Sapozhnikov

(10) Patent No.: US 7,570,461 B2
(45) Date of Patent: Aug. 4, 2009

(54) MAGNETIC SENSOR WITH IN-STACK BIASING

(75) Inventor: Victor B. Sapozhnikov, Minnetonka, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 537 days.

(21) Appl. No.: 11/068,261

(22) Filed: Feb. 28, 2005

(65) Prior Publication Data

US 2005/0128654 A1    Jun. 16, 2005

(51) Int. Cl.
G11B 5/127 (2006.01)
G11B 5/33 (2006.01)

(52) U.S. Cl. ............. 360/324.12; 360/327.2; 360/327.3

(58) Field of Classification Search ............ 360/324.12, 360/327.2, 327.23, 327.3, 327.31, 327.32; 324/252, 207.21, 207.22; 338/32 R; 428/811–811.5
See application file for complete search history.

(56) References Cited

U.S. PATENT DOCUMENTS

| | | | |
|---|---|---|---|
| 5,576,914 A * | 11/1996 | Rottmayer et al. ......... 360/324 |
| 5,737,155 A | 4/1998 | Geroge et al. | |
| 6,023,395 A | 2/2000 | Dill et al. | |
| 6,074,767 A * | 6/2000 | Lin ......................... 428/811.2 |
| 6,114,719 A | 9/2000 | Dill et al. | |
| 6,473,279 B2 | 10/2002 | Smith et al. | |
| 6,556,392 B1 | 4/2003 | Mao et al. | |
| 6,724,583 B2 | 4/2004 | Seigler et al. | |
| 6,831,816 B2 | 12/2004 | Gill | |
| 6,958,892 B2 * | 10/2005 | Gill ....................... 360/324.12 |
| 6,967,825 B2 * | 11/2005 | Gill ....................... 360/324.12 |
| 6,980,403 B2 * | 12/2005 | Hasegawa ................. 360/319 |
| 6,985,338 B2 * | 1/2006 | Gill ....................... 360/324.12 |
| 7,050,276 B2 * | 5/2006 | Nishiyama ............. 360/324.11 |
| 7,132,175 B2 * | 11/2006 | Hasegawa et al. ......... 428/811.2 |
| 2003/0174446 A1 * | 9/2003 | Hasegawa ................. 360/319 |
| 2003/0214765 A1 | 11/2003 | Ghaly et al. | |
| 2004/0252419 A1 * | 12/2004 | Takano .................. 360/324.12 |
| 2005/0024794 A1 * | 2/2005 | Gill ....................... 360/324.12 |
| 2005/0225906 A1 * | 10/2005 | Garfunkel .............. 360/324.12 |
| 2005/0264956 A1 * | 12/2005 | Lee et al. ............... 360/324.12 |
| 2006/0007607 A1 * | 1/2006 | Abe et al. .............. 360/324.12 |
| 2006/0044707 A1 * | 3/2006 | Araki et al. ............ 360/324.12 |
| 2006/0092581 A1 * | 5/2006 | Zheng et al. ........... 360/324.12 |
| 2006/0158792 A1 * | 7/2006 | Gill ....................... 360/324.11 |
| 2008/0062585 A1 * | 3/2008 | Guo et al. .............. 360/324.12 |

* cited by examiner

Primary Examiner—Brian E Miller
(74) Attorney, Agent, or Firm—Kinney & Lange, P.A.

(57) ABSTRACT

A magnetic sensor includes a sensor stack having a sensing layer. A first biasing structure having a first magnetization vector is positioned adjacent to the sensor stack to produce a biasing field that biases the sensing layer. A second biasing structure having a second magnetization vector is positioned within the sensor stack relative to the sensing layer to counter the biasing field at a center of the sensing layer.

16 Claims, 4 Drawing Sheets

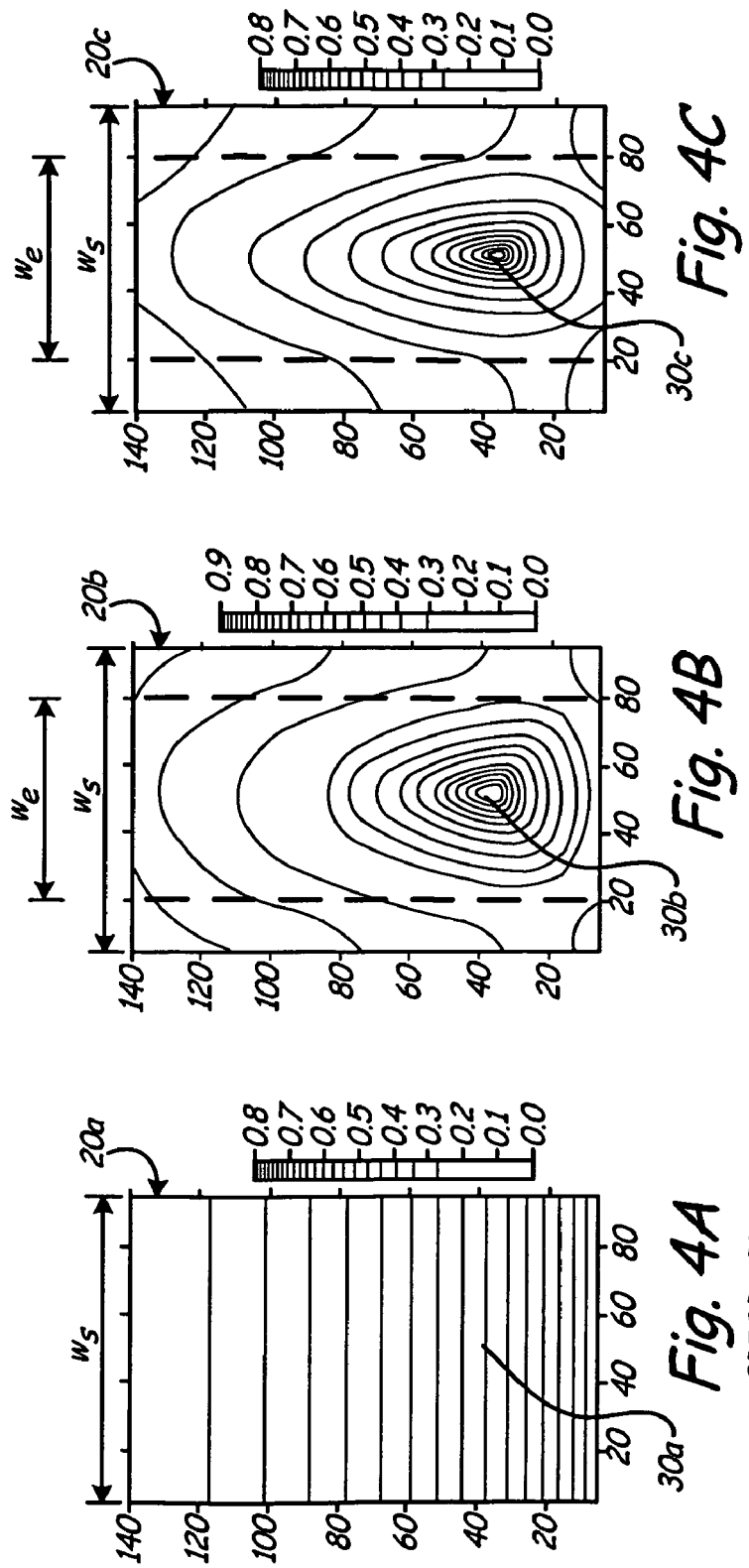

MAGNETIC SENSOR WITH IN-STACK BIASING

BACKGROUND OF THE INVENTION

The present invention relates to magnetic data storage and retrieval systems. More particularly, the present invention relates to a system for biasing and stabilizing a magnetic sensor with in-stack biasing structures.

In an electronic data storage and retrieval system, a magnetic recording head typically includes a reader portion having a sensor for retrieving magnetically encoded information stored on a magnetic disc. Magnetic flux from the surface of the disc causes rotation of the magnetization vector of a sensing layer or layers of the sensor, which in turn causes a change in the electrical properties of the sensor. The sensing layers are often called free layers, since the magnetization vectors of the sensing layers are free to rotate in response to external magnetic flux. The change in the electrical properties of the sensor may be detected by passing a current through the sensor and measuring a voltage across the sensor. Depending on the geometry of the device, the sense current may be passed in the plane (CIP) of the layers of the device or perpendicular to the plane (CPP) of the layers of the device. External circuitry then converts the voltage information into an appropriate format and manipulates that information as necessary to recover information encoded on the disc.

An essential structure in contemporary read heads is a thin film multilayer structure containing ferromagnetic material that exhibits some type of magnetoresistance (MR). Examples of magnetoresistive phenomena include anisotropic magnetoresistance (AMR), giant magnetoresistance (GMR), and tunneling magnetoresistance (TMR).

AMR sensors generally have a single MR layer formed of a ferromagnetic material. The resistance of the MR layer varies as a function of $\cos^2 \alpha$, where $\alpha$ is the angle formed between the magnetization vector of the MR layer and the direction of the sense current flowing in the MR layer.

GMR sensors have a series of alternating magnetic and nonmagnetic layers. The resistance of GMR sensors varies as a function of the spin-dependent transmission of the conduction electrons between the magnetic layers separated by the nonmagnetic layer and the spin-dependent scattering that takes place at the interface of the magnetic and nonmagnetic layers and within the magnetic layers. The resistance of a GMR sensor depends on the relative orientations of the magnetization in consecutive magnetic layers, and varies as the cosine of the angle between the magnetization vectors of consecutive magnetic layers.

A typical GMR read sensor configuration is the GMR spin valve, in which the GMR read sensor is a multi-layered structure formed of a nonmagnetic spacer layer positioned between a synthetic antiferromagnet (SAF) and a ferromagnetic free layer, or between two ferromagnetic free layers. In the former structure, the magnetization of the SAF is fixed, typically normal to an air bearing surface of the GMR read sensor, while the magnetization of the free layer rotates freely in response to an external magnetic field. The SAF includes a reference layer and a pinned layer that are magnetically coupled by a coupling layer such that the magnetization direction of the reference layer is opposite to the magnetization of the pinned layer. In the latter structure, the magnetizations of the two free layers rotate freely in response to an external magnetic field. The resistance of the GMR read sensor varies as a function of an angle formed between the magnetization direction of the free layer and the magnetization direction of the reference layer of the SAF, or as a function of an angle formed between the magnetization directions of the two free layers.

TMR sensors have a configuration similar to GMR sensors, except that the magnetic layers of the sensor are separated by an insulating film thin enough to allow electron tunneling between the magnetic layers. The tunneling probability of an electron incident on the barrier from one magnetic layer depends on the character of the electron wave function and the spin of the electron relative to the magnetization direction in the other magnetic layer. As a consequence, the resistance of the TMR sensor depends on the relative orientations of the magnetization of the magnetic layers, exhibiting a minimum for a configuration in which the magnetizations of the magnetic layers are parallel and a maximum for a configuration in which the magnetizations of the magnetic layers are antiparallel.

For all types of MR sensors, magnetization rotation occurs in response to magnetic flux from the disc. As the recording density of magnetic discs continues to increase, the width of the tracks on the disc must decrease, which necessitates a smaller sensor. As sensors become smaller in size, particularly for sensors with dimensions less than about 0.1 micrometers ($\mu$m), more of the signal is derived from magnetization rotation that occurs at the edges of the sensor rather than at the center of the sensor. This leads to several undesirable consequences. For example, conventional readers suffer from poor scaling in that as the cross-track width of the sensor decreases, the reader signal amplitude drops disproportionately faster than the decreasing width. In addition, the cross-track resolution of the sensor is deleteriously affected because the electrical width of the sensor is increased from the increased signal at the edges of the sensor. Furthermore, manufacturing defects are more likely to be present near the edges of the sensor, which may result in a noisy reader signal. Magnetic sensors must be designed in such a manner that even small sensors are free from magnetic noise and provide a signal with adequate amplitude and accurate recovery of data written on the disc.

BRIEF SUMMARY OF THE INVENTION

The present invention is a magnetic sensor including a sensor stack having a sensing layer. A first biasing structure having a first magnetization vector is positioned adjacent to the sensor stack to produce a first biasing field that biases the sensing layer. A second biasing structure having a second magnetization vector is positioned within the sensor stack relative to the sensing layer to produce a second biasing field that counters the first biasing field at a center portion of the sensing layer.

BRIEF DESCRIPTION OF THE DRAWINGS

FIG. 4A is a normalized signal map of the free layer in a conventional magnetic sensor without an in-stack biasing element.

FIG. 4B is a normalized signal map of the free layer in a magnetic sensor according to an embodiment of the present invention including an in-stack biasing element having a cross-track width of 55 nm.

FIG. 4C is a normalized signal map of the free layer in a magnetic sensor according to another embodiment of the present invention including an in-stack biasing element having a cross-track width of 35 nm.

DETAILED DESCRIPTION

Figure 1:
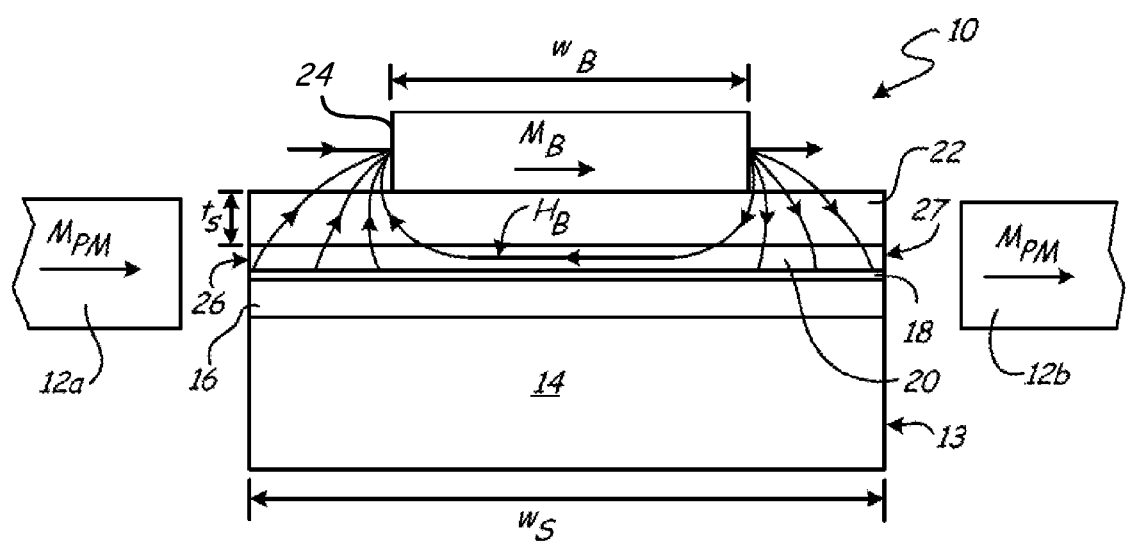
FIG. 1 is a layer diagram of a magnetic sensor according to the present invention.

FIG. 1 is a layer diagram of magnetic sensor 10 according to the present invention. Magnetic sensor 10 includes permanent magnets 12a and 12b and sensor stack 13. Permanent magnets 12a and 12b are positioned on opposite sides of sensor stack 13. Sensor stack 13 includes pinning layer 14, pinned layer 16, spacer layer 18, free or sensing layer 20, nonmagnetic spacer layer 22, and in-stack biasing element 24. Pinned layer 16 is positioned over pinning layer 14. Spacer layer 18 is positioned over pinned layer 16. Free layer 20 is positioned over spacer layer 18. Nonmagnetic spacer layer 22 is positioned over free layer 20. In-stack biasing element 24 is positioned over nonmagnetic spacer layer 22.

In one embodiment, sensor stack 13 comprises a bottom spin valve sensor configuration. In this embodiment, pinning layer 14 is comprised of an antiferromagnetic material such as IrMn, PtMn, NiMn, RhMn, RuRhMn. Pinned layer 16 is a synthetic antiferromagnet (SAF), which includes two ferromagnetic layers, such as two CoFe layers, separated by a Ru spacer. When two ferromagnetic layers are separated by a Ru spacer of an appropriate thickness, the two ferromagnetic layers couple strongly with magnetic moments anti-parallel. The use of a synthetic antiferromagnet for pinned layer 16 provides a reduced demagnetization field and better magnetic stability. Spacer layer 18 is comprised of Cu, although other materials including Au, Ag, NiFeCr, Al, and Ru can alternatively be used. Free layer 20 is comprised of a ferromagnetic material such as NiFe.

Permanent magnets 12a and 12b are positioned on opposite sides of sensor stack 13. Permanent magnets 12a and 12b have a magnetization $M_{PM}$ that provides longitudinal biasing for free layer 20 in the direction of magnetization $M_{PM}$. Permanent magnets 12a and 12b are generally formed of a hard magnetic material, such as CoCrPt, CoCr, CoCrTa, CoCrTaPt, CoPt, or CoNiCr. For magnetic sensor 10 to operate properly, free layer 20 must be stabilized against the formation of edge domains. Domain wall motion results in electric noise, which makes data recovery difficult or impossible. The magnetostatic field from permanent magnets 12a and 12b stabilizes free layer 20, prevents edge domain formation in free layer 20, and provides proper bias for free layer 20 in the direction of the magnetostatic field.

As magnetic sensors become smaller in size, more of the signal is derived from magnetization rotation that occurs at the edges of the sensor rather than at the center of the sensor. This leads to several undesirable consequences. For example, conventional sensors suffer from poor scaling in that as the cross-track width of the sensor decreases, the sensor signal amplitude drops disproportionately faster than the decreasing width. In addition, the cross-track resolution of the sensor is deleteriously affected because the electrical width of the sensor is increased from the increased signal at the edges of the sensor. Also, manufacturing defects are more likely to be present near the edges of the sensor, which may result in a noisy reader signal. Sensors must be designed in such a manner that even small sensors are free from magnetic noise and provide a signal with adequate amplitude and accurate recovery of data written on the disc.

To resolve these and other issues, in-stack biasing element 24 is provided in sensor stack 13. It should be noted that the term "in" when used to describe the positioning of in-stack biasing element 24 relative to sensor stack 13 means on the bottom of sensor stack 13, on the top of sensor stack 13, or anywhere within sensor stack 13 between the top and bottom of sensor stack 13. In the embodiment shown, in-stack biasing element 24 is separated from free layer 20 by nonmagnetic spacer layer 22. In one embodiment, in-stack biasing element 24 is a permanent magnet formed of a hard magnetic material, such as CoCrPt, CoCr, CoCrTa, CoCrTaPt, CoPt, or CoNiCr. In-stack biasing element 24 has a magnetization $M_B$ that is substantially parallel to and substantially co-directional with magnetization $M_{PM}$ of permanent magnets 12a and 12b. Magnetizing in-stack biasing element 24 in the same direction as permanent magnets 12a and 12b simplifies manufacture of magnetic sensor 10 in that in-stack biasing element 24 and permanent magnets 12a and 12b may be set (i.e., magnetized) during the manufacturing process by the same magnetic field.

In-stack biasing element 24 produces magnetic field $H_B$. In-stack biasing element 24 is positioned relative to free layer 20 such that magnetic field $H_B$ from in-stack biasing element 24 opposes and weakens the biasing field produced by permanent magnets 12a and 12b at the center of free layer 20 in the cross-track direction. In addition, in-stack biasing element 24 is positioned relative to free layer 20 such that magnetic field $H_B$ strengthens the biasing field produced by permanent magnets 12a and 12b at edges 26 and 27 of free layer 20. As a result, the center portion of free layer 20 becomes magnetically softer and produces most of the signal in magnetic sensor 10, while the portions of free layer 20 near edges 26 and 27 becomes magnetically stiffer and produce less of the signal in magnetic sensor 10. In other words, the magnetization is freer to rotate in response to magnetic flux from a magnetic medium at the center of free layer 20.

The effect that magnetic field $H_B$ from in-stack biasing element 24 has on the biasing field produced by permanent magnets 12a and 12b is controllable by various factors. For example, the strength of in-stack biasing element 24 (i.e., the magnitude of magnetization $M_B$) and the thickness $t_S$ of spacer layer 20 are selectable to vary the magnitude and direction of the biasing field at the center of free layer 20. Depending on the magnitude of magnetization $M_B$ and the thickness $t_s$ of spacer layer 22, the resulting biasing field at the center of free layer 20 may be in the same direction as or in the opposite direction of the biasing field produced by permanent magnets 12a and 12b. The magnitude and direction of the biasing field at the center of free layer 20 may thus be accurately tailored to design requirements.

The cross-track width $w_B$ of in-stack biasing element 24 is also selectable to vary the magnitude and direction of the biasing field at the center of free layer 20. In addition, the cross-track width $w_B$ controls the relative dimensions of the magnetically softened and stiffened portions of free layer 20. That is, a smaller cross-track width $w_B$ for in-stack biasing element 24 results in a narrower softened region in free layer 20, while a larger cross-track width $w_B$ for in-stack biasing element 24 results in a wider softened region in free layer 20. Thus, the cross-track width of the portion of free layer 20 that produces most of the signal may be accurately controlled as design requirements dictate by adjusting the cross-track width $w_B$ of in-stack biasing element 24. In one embodiment, shown in FIG. 1, in-stack biasing element 24 has a cross-track width $w_B$ that is less than the cross-track width $w_S$ of sensor stack 13 (i.e., $w_B<w_S$).

Figure 2:
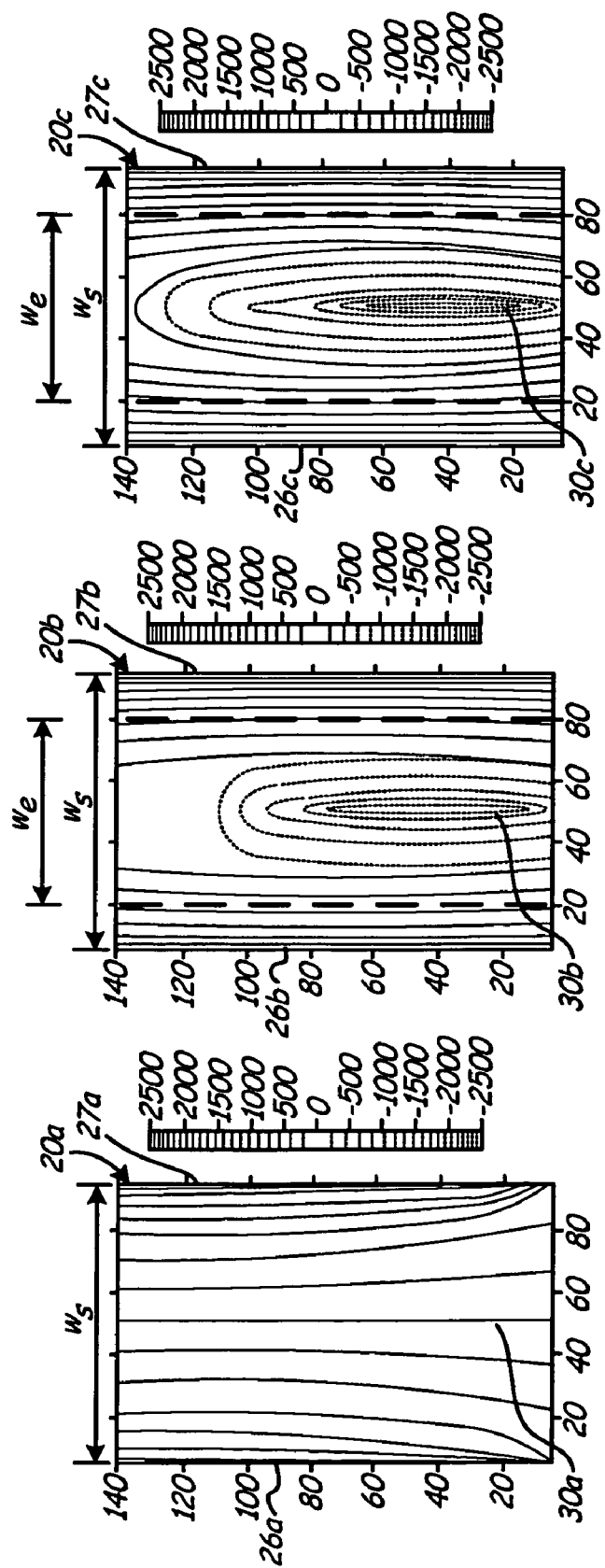
FIG. 2A is a bias field map of the free layer in a conventional magnetic sensor without an in-stack biasing element.
FIG. 2B is a bias field map of the free layer in a magnetic sensor according to an embodiment of the present invention including an in-stack biasing element having a cross-track width of 55 nm.
FIG. 2C is a bias field map of the free layer in a magnetic sensor according to another embodiment of the present invention including an in-stack biasing element having a cross-track width of 35 nm.

To demonstrate the effect of in-stack biasing element 24 on the biasing field in free layer 20, comparative modeling results of a conventional magnetic sensor (i.e., no in-stack biasing element 24) and magnetic sensors according to the present invention are provided herein. FIG. 2A is a bias field map of free layer 20a in a conventional magnetic sensor with no in-stack biasing element 24 and a sensor stack 13 having a cross-track width $w_S$ of 95 mm. FIG. 2B is a bias field map of free layer 20b in a magnetic sensor according to the present invention including in-stack biasing element 24 having a cross-track width $w_B$ of 55 nm in a sensor stack 13 having a cross-track width $w_S$ of 95 nm. FIG. 2C is a bias field map of free layer 20c in a magnetic sensor according to the present invention including in-stack biasing element 24 having a cross-track width $w_B$ of 35 nm in a sensor stack 13 having a cross-track width $w_S$ of 95 nm.

In free layer 20a (FIG. 2A) of a conventional magnetic sensor, the stabilizing bias field is provided by permanent magnets 12a and 12b positioned adjacent to sensor stack 13. The biasing field at edges 26a and 27a is stronger due to their proximity to permanent magnets 12a and 12b, respectively, than at center 30a of free layer 20a. However, the biasing field across most of free layer 20 is insufficient to prevent magnetization rotation from occurring near edges 26a and 26b, and much of the sensor signal is derived from magnetization rotation that occurs near these edges rather than at center 30a of the sensor. As a result, conventional sensors with permanent magnet biasing suffers from poor scaling, reduced cross-track resolution, and a noisy reader signal caused by manufacturing defects near the edges of the sensor.

In a magnetic sensor according to the present invention including in-stack biasing element 24 having a cross-track width $w_B$ of 55 nm (FIG. 2B) or 35 nm (FIG. 2C), the biasing field in the free layer (free layer 20b in FIG. 2B and free layer 20c in FIG. 2C) is increased near the edges and decreased toward the center of the free layer as compared to free layer 20a in a conventional magnetic sensor without in-stack biasing element 24 (FIG. 2A). In free layer 20b, the magnitude of magnetization $M_B$ and the positioning of in-stack biasing element 24 relative to free layer 20b is such that the biasing field around center 30b of free layer 20b is weakened and reversed relative to the biasing field produced by permanent magnets 12a and 12b. In addition, the biasing field produced by permanent magnets 12a and 12b is strengthened around edges 26b and 27b of free layer 20b. This reduces the effective width $w_e$ of free layer 20b (that is, the width of the signal producing portion in free layer 20b) to the center approximately 60 nm of free layer 20b. Likewise, in free layer 20c, the magnitude of magnetization $M_B$ and the positioning of in-stack biasing element 24 relative to free layer 20c is such that the biasing field around center 30c of free layer 20c is weakened and reversed relative to the biasing field produced by permanent magnets 12a and 12b. Also, the biasing field produced by permanent magnets 12a and 12b is strengthened around edges 26c and 27c of free layer 20c. This reduces the effective width we of free layer 20c (that is, the width of the signal producing portion in free layer 20c) to the center approximately 40 nm of free layer 20c. In both free layer 20b and free layer 20c, the center portion of the free layer becomes magnetically softer and produces most of the signal in the magnetic sensor, while the portions of the free layer near the edges become magnetically stiffer and produce less of the signal in the magnetic sensor.

Figure 3:
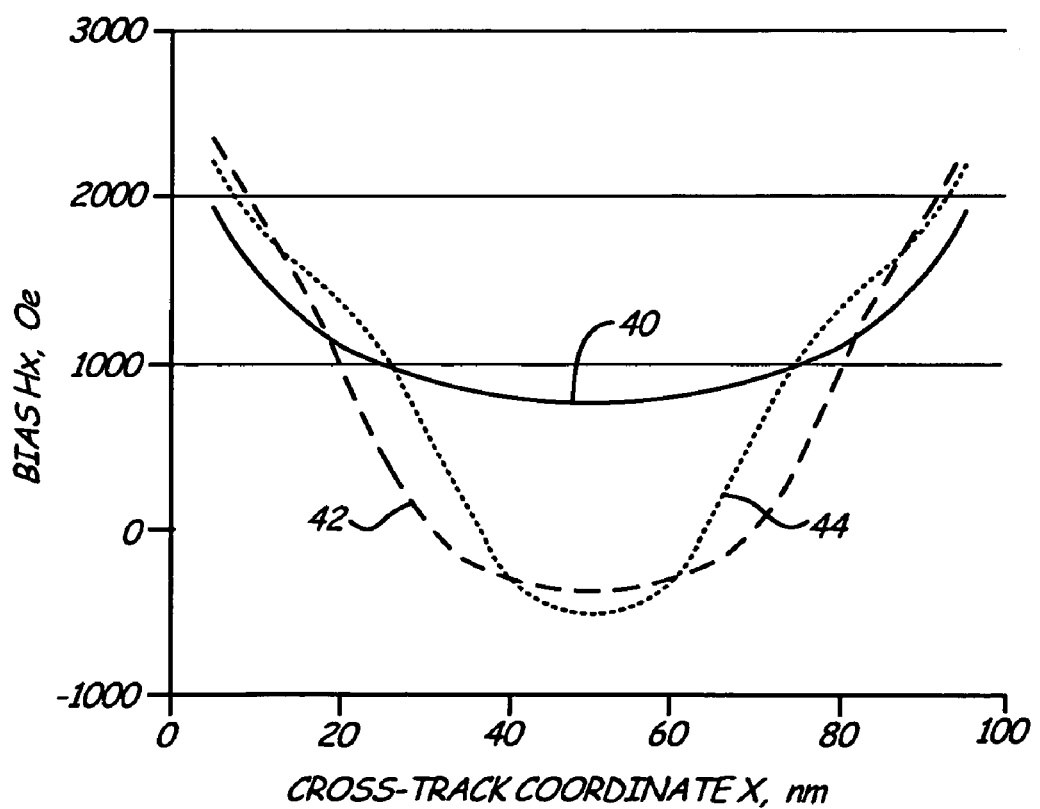
FIG. 3 is a graph of the cross-track bias magnetic field in a free layer of a conventional magnetic sensor without an in-stack biasing element, a magnetic sensors according to the present invention including an in-stack biasing element having a cross-track width of 55 nm, and a magnetic sensor according to the present invention including an in-stack biasing element having a cross-track width of 35 nm.

FIG. 3 is a graph of the cross-track bias magnetic field in the magnetic sensor configurations shown in FIGS. 2A-2C. In particular, line 40 is a graph of the cross-track bias magnetic field in free layer 20a (FIG. 2A), line 42 is a graph the cross-track bias magnetic field in free layer 20b (FIG. 2B), and line 44 is a graph of the cross-track bias magnetic field in free layer 20c (FIG. 2C). As is shown in FIG. 3, the biasing field in a magnetic sensor including in-stack biasing element 24 (lines 42 and 44) is increased near the edges and decreased toward the center of the free layer as compared to a conventional magnetic sensor without in-stack biasing element 24 (line 40). As a result, the center portion of the free layer becomes softer and produces most of the signal in the magnetic sensor, while the portions of the free layer near the edges of the free layer become stiffer and produce less of the signal in the magnetic sensor. In addition, a smaller cross-track width $w_B$ for in-stack biasing element 24 (line 44) results in a narrower softened region in the free layer, while a larger cross-track width $w_B$ for in-stack biasing element 24 (line 42) results in a wider magnetically softened region in the free layer. Thus, the portion of the free layer that is magnetically softened and produces most of the signal in the magnetic sensor is controllable by altering the cross-track width $w_B$ of in-stack biasing element 24.

As discussed above, by incorporating in-stack biasing element 24 according to the present invention, the center portion of the free layer is softened to allow freer magnetization rotation. The normalized signal intensity in the free layer is the magnetization rotation that occurs in the free layer normalized by the maximum possible magnetization rotation (i.e., 180°) in the free layer. This normalized signal intensity may be modeled at all points on the free layer to produce a normalized signal intensity map. FIGS. 4A shows a normalized signal intensity map for free layer 20a in a conventional magnetic sensor without in-stack biasing element 24. FIG. 4B shows a normalized signal intensity map for free layer 20b in a magnetic sensor according to the present invention including in-stack biasing element 24 having a cross-track width $w_B$ of 55 nm. FIG. 4C shows a normalized signal intensity map for free layer 20c in a magnetic sensor according to the present invention including in-stack biasing element 24 having a cross-track width $w_B$ of 35 nm.

In a conventional magnetic sensor, free layer 20a has poor magnetization rotation around center 30a (FIG. 4A), which causes much of the signal to be derived from edges 26a and 27a of free layer 20a. As discussed above, in small sensors this can lead to poor scaling, reduced cross-track resolution, and a noisy reader signal caused by manufacturing defects near the edges of the sensor. On the other hand, in a magnetic sensor incorporating in-stack biasing element 24, the center portion of the free layer is magnetically softened and the edge portions of the free layer is stiffened. This translates to greater magnetization rotation near the center of the free layer and less magnetization rotation near the edges of the free layer. This is shown in the normalized signal intensity maps of FIGS. 4B and 4C, which show free layers 20b and 20c having high magnetization rotation near centers 30b and 30c, respectively. This results in much of the signal being derived from the center portion of the free layers. By producing most of the signal near the center magnetic sensor, magnetic sensors according to the present invention produce a signal with an improved cross-track resolution, better scaling, and reduced risk of a noisy signal due to manufacturing defects present near the edges of the sensor.

In-stack biasing element 24 has been shown and described with a cross-track width $w_B$ less than the cross-track width $w_S$ of the sensor stack. It should be noted that the cross-track width $w_B$ may also be substantially equal to the sensor stack cross track width $w_S$. While the improvement in cross-track resolution is not as significant in a magnetic sensor including in-stack biasing element 24 having a cross-track width $w_B$ substantially equal to the sensor stack width $w_S$, a larger increase in the sensor signal is achieved with in-stack biasing element 24 having this characteristic. The table below compares the magnitude of the signal produced (mV) and the cross-track resolution (nm) in (1) a conventional magnetic sensor without in-stack biasing element 24, (2) a magnetic sensors according to the present invention including an in-stack magnet having a cross-track width of 95 nm, (3) a magnetic sensors according to the present invention including an in-stack magnet having a cross-track width of 55 nm, and (4) a magnetic sensors according to the present invention including an in-stack magnet having a cross-track width of 35 nm.

| Sensor Configuration | Sensor Signal | Cross-track Resolution |
| --- | --- | --- |
| Without in-stack biasing element 24, $w_S$ = 95 nm | 3.27 mV | 115.1 nm |
| With in-stack biasing element 24, $w_S$ = 95 nm, $w_B$ = 95 nm | 8.23 mV | 102.9 nm |
| With in-stack biasing element 24, $w_S$ = 95 nm, $w_B$ = 55 nm | 6.73 mV | 88.9 nm |
| With in-stack biasing element 24, $w_S$ = 95 nm, $w_B$ = 35 nm | 5.46 mV | 87.6 nm |

Various modifications may be made to the magnetic sensors described without departing from the spirit and scope of the present invention. For example, while in-stack biasing element 24 has been shown and described in a magnetic sensor having a bottom spin valve configuration, in-stack biasing element 24 may be incorporated into any type of magnetic sensor requiring the sensing layer to be longitudinally stabilized against the formation of edge domains. In addition, while only one in-stack biasing element 24 is shown incorporated into sensor stack 13, two or more in-stack biasing elements may alternatively be incorporated into sensor stack 13 to provide additional means for controlling the magnitude and direction of the biasing field at the center and edges of free layer 20 and of the portion of free layer 20 that produces the most of the sensor signal.

In summary, as magnetic sensors become smaller in size, more of the signal is derived from magnetization rotation that occurs at the edges of the sensor rather than at the center of the sensor. This leads to several undesirable consequences, such as poor scaling, reduced cross-track resolution, and a noisy reader signal caused by manufacturing defects near the edges of the sensor. The present invention is a magnetic sensor that addresses these and other issues by the interaction of two biasing structures. A first biasing structure having a first magnetization vector is positioned adjacent to the sensor stack to produce a biasing field that biases the sensing layer. A second biasing structure having a second magnetization vector is positioned in the sensor stack relative to the sensing layer to counter the biasing field at a center of the sensing layer.

The invention claimed is:

1. A magnetic sensor comprising:
   a sensor stack including a sensing layer;
   a first biasing structure having a first magnetization vector and positioned adjacent to the sensor stack to produce a biasing field that biases the sensing layer;
   a second biasing structure having a second magnetization vector and a cross-track width substantially less than a cross-track width of the sensing layer, the second biasing structure sized and positioned in the sensor stack relative to the sensing layer to weaken the biasing field in a center portion of the sensing layer while strengthening the biasing field of the sensing layer proximate at least one edge of the sensor stack.

2. The magnetic sensor of claim 1, wherein the first magnetization vector and the second magnetization vector are substantially parallel.

3. The magnetic sensor of claim 1, wherein the first magnetization vector and the second magnetization vector are co-directional.

4. The magnetic sensor of claim 1, wherein the magnitude of the biasing field at the center portion of the sensing layer is a function of the cross-track width of the second biasing structure.

5. The magnetic sensor of claim 1, wherein the magnitude of the biasing field at the center portion of the sensing layer is a function of a distance between the sensing layer and the second biasing structure.

6. The magnetic sensor of claim 1, wherein the magnitude of the biasing field at the center portion of the sensing layer is a function of a magnitude of the second magnetization vector.

7. The magnetic sensor of claim 1, wherein a nonmagnetic metal is disposed in the sensor stack between the sensing layer and the second biasing structure.

8. The magnetic sensor of claim 1, wherein the second biasing structure comprises a permanent magnet.

9. The magnetic sensor of claim 1, wherein the first biasing structure comprises first and second permanent magnets disposed on opposite sides of the sensor stack.

10. A magnetic sensor comprising:
    a sensing layer having a first bias edge and a second bias edge;
    first and second biasing elements, the first biasing element positioned adjacent the first bias edge and the second biasing element positioned adjacent the second bias edge to produce a biasing field that biases the sensing layer; and
    a permanent magnet having a magnetization direction substantially similar to a direction of the biasing field, and a cross-track width substantially less than a cross-track width of the sensing layer, the permanent magnet sized and positioned relative to the sensing layer such that magnetic fields from the permanent magnet weaken the biasing field in a center portion of the sensing layer and strengthen the biasing field in the sensing layer proximate at least one of the first and second bias edges.

11. The magnetic sensor of claim 10, wherein the magnetic fields from the permanent magnet reverse the direction of the biasing field in the center portion of the sensing layer.

12. The magnetic sensor of claim 10, wherein the magnetic fields from the permanent magnet strengthen the biasing field proximate the first and second bias edges.

13. The magnetic sensor of claim 10, wherein a nonmagnetic metal is disposed in the sensor stack between the sensing layer and the second biasing structure.

14. The magnetic sensor of claim 10, wherein the first and second biasing elements comprise permanent magnets.

15. A method of biasing a sensing layer in a sensor stack, the method comprising:

biasing the sensing layer with a first biasing field; and biasing the sensing layer with a second biasing field from an in-stack biasing source having a magnetization direction substantially parallel to the first biasing field and an effective cross-track width less than an effective cross-track width of the sensing layer, the in-stack biasing source sized and positioned relative to the sensing layer such that magnetic fields from the in-stack biasing source reduce a magnitude of the first biasing field in a center portion of the sensing layer and increase a magnitude of the first biasing field proximate at least one edge of the sensing layer.

16. The method of claim 15 wherein the magnetic fields from the in-stack biasing source increase a magnitude of the first biasing field proximate the first and second edges of the sensing layer on opposite sides of the center portion of the sensing layer.

* * * * *

UNITED STATES PATENT AND TRADEMARK OFFICE
CERTIFICATE OF CORRECTION

PATENT NO. : 7,570,461 B2
APPLICATION NO. : 11/068261
DATED : August 4, 2009
INVENTOR(S) : Victor B. Sapozhnikov It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1055 days.

Signed and Sealed this

Seventh Day of September, 2010

David J. Kappos
*Director of the United States Patent and Trademark Office*